July 27, 1965 V. A. PREVALLET, JR 3,197,714

CONTROL SYSTEMS UTILIZING TUNING FORKS

Filed Oct. 6, 1960 2 Sheets-Sheet 1

INVENTOR.
VAL A. PREVALLET, JR.

BY Rey Eilers
ATT'Y.

July 27, 1965 V. A. PREVALLET, JR 3,197,714

CONTROL SYSTEMS UTILIZING TUNING FORKS

Filed Oct. 6, 1960 2 Sheets-Sheet 2

INVENTOR.
VAL A. PREVALLET, JR.

BY Roy Eilers ATT'Y.

United States Patent Office 3,197,714
Patented July 27, 1965

3,197,714
CONTROL SYSTEMS UTILIZING TUNING FORKS

Val A. Prevallet, Jr., Ferguson, Mo., assignor to Sperry Rand Corporation, a corporation of Delaware
Filed Oct. 6, 1960, Ser. No. 60,912
6 Claims. (Cl. 331—1)

Figures 1, 4:
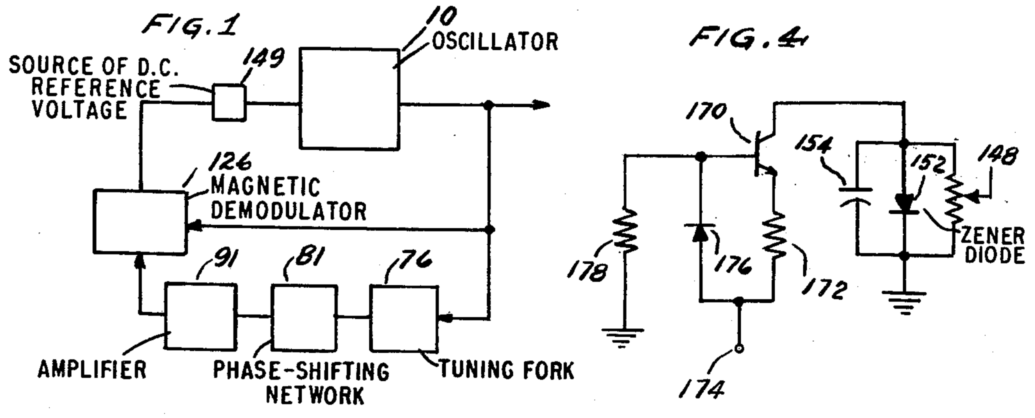

This invention relates to improvements in control systems utilizing tuning forks. More particularly, this invention relates to improvements in control systems utilizing tuning forks that can provide an accurate frequency reference.

It is therefore an object of the present invention to provide an improved control system utilizing a tuning fork that can provide an accurate frequency reference.

It is frequently desirable to provide a control system that can supply an accurate frequency reference. In recognition of that fact, control systems have been developed that utilized tuning forks as the frequency determining elements; because tuning forks inherently possess a high degree of frequency stability. In such control systems, the amplitudes of oscillation of the tuning forks vary in response to changes in the supervised frequencies, and those variations in the amplitudes of oscillation are used to restore the supervised frequencies to their specified values. Such control systems are usable; but it would be desirable to provide a control system that could provide an even more accurate frequency reference. The present invention provides such a control system; and it is therefore an object of the present invention to provide a control system which provides an extremely accurate frequency reference.

The output voltage of a tuning fork is at its maximum value whenever that tuning fork is operating at its resonant frequency; and that output voltage will remain at its maximum value as long as the specified value of the supervised frequency is maintained. However, when the value of the supervised frequency changes, the output voltage of the tuning fork will fall. That output voltage will not fall very rapidly, however, because the amplitude characteristic of a tuning fork is substantially flat for about forty five degrees of lead or lag relative to the resonant frequency. As a result, an appreciable change in the value of the supervised frequency can occur before the output voltage of the tuning fork can change sufficiently to enable the control system to start restoring the supervised frequency to its specified value. Such an appreciable change in the value of the supervised frequency is undesirable; and hence control systems that rely upon the amplitude response of a tuning fork are objectionable.

The control system provided by the present invention avoids any such appreciable change in the value of the supervised frequency by utilizing the phase response of the tuning fork; because that phase response changes rapidly as the supervised frequency changes. Specifically, when the tuning fork is operating at its resonant frequency, there will be zero phase shift between the voltages in the input and output coils of the tuning fork; but there will be a leading phase shift of nearly ninety degrees immediately below resonance, and there will be a lagging phase shift of nearly ninety degrees immediately above resonance. As a result, even small changes in the supervised frequency will cause a large phase shift between the voltages in the input and output coils of the tuning fork; and that phase shift enables the control system to promptly start restoring the supervised frequency to its specified value. In this way, the control system provided by the present invention is enabled to maintain the supervised frequency within very close limits. It is therefore an object of the present invention to provide a control system that utilizes a tuning fork as the frequency determining element, and that relies upon the phase response of that tuning fork.

Other and further objects and advantages of the present invention should become apparent from an examination of the drawing and accompanying description.

In the drawing and accompanying description a preferred embodiment of the present invention is shown and described but it is to be understood that the drawing and accompanying description are for the purpose of illustration only and do not limit the invention and that the invention will be defined by the appended claims.

Figure 3:
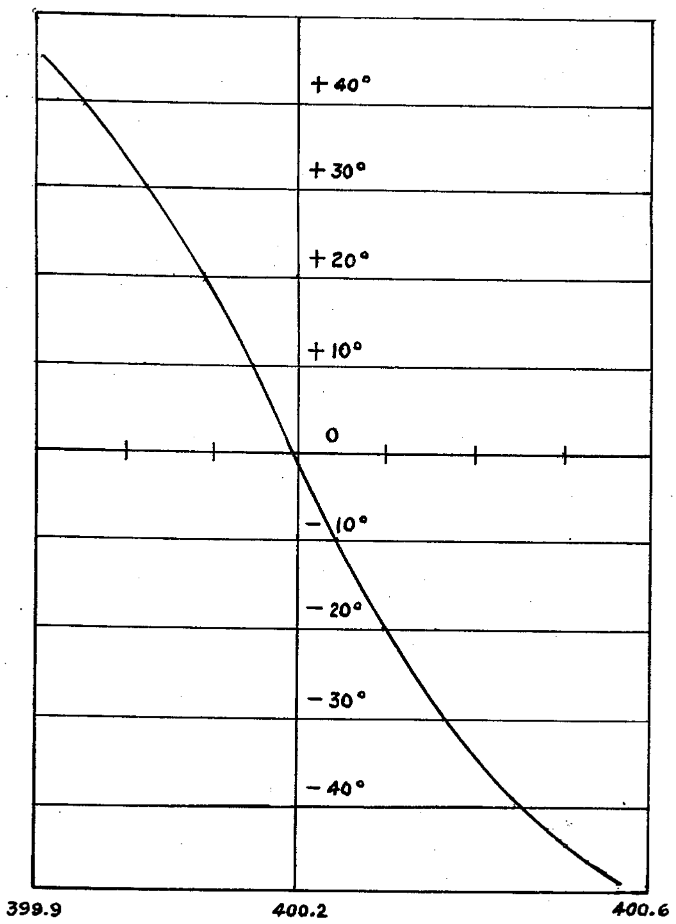
Figure 2:
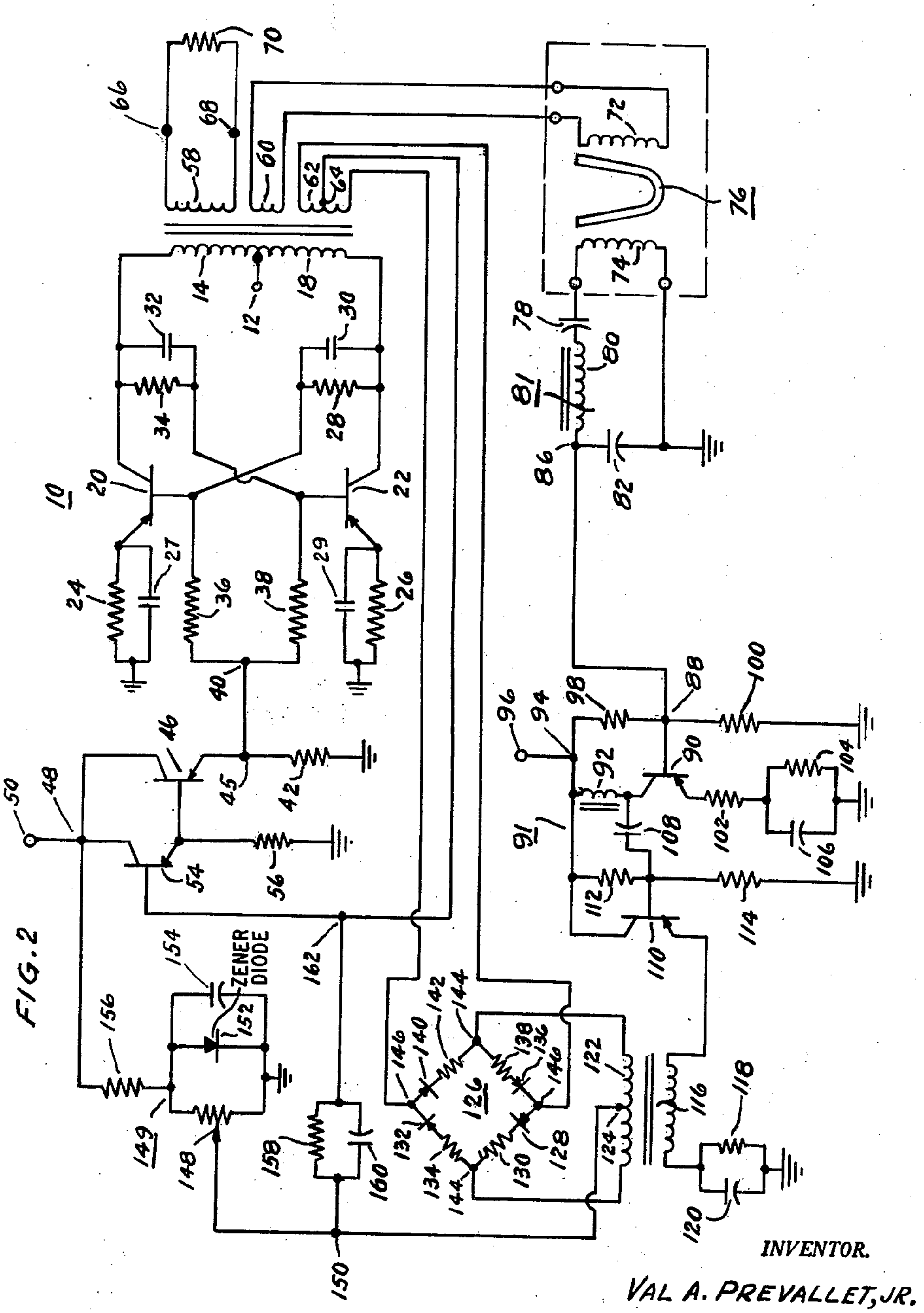

In the drawing, FIG. 1 is a block diagram of one form of control system that is made in accordance with the principles and teachings of the present invention, FIG. 2 is a schematic diagram of the control system of FIG. 1, FIG. 3 is a graph showing a curve of the type obtainable with the control system of FIGS. 1 and 2, and FIG. 4 is a schematic diagram of a constant current source for the Zener diode shown in FIG. 2.

Referring to the drawing in detail, the numeral 10 generally denotes an oscillator that is used in the control system provided by the present invention. Different oscillators could be used; and the principal requirements of the oscillator 10 are that it must be stable in operation and that it must vary its frequency in response to changes in the D.C. control voltage supplied to it. The numeral 76 generally denotes the tuning fork that is used as the frequency determining element of the control system; and the input coil of that tuning fork is coupled to the output of the oscillator 10. The numeral 81 generally denotes a phase-shifting network; and that network is coupled to the output coil of the tuning fork 76. The numeral 91 generally denotes an amplifier which amplifies the output of the phase-shifting network 81 and supplies that amplified output to a magnetic demodulator which is generally denoted by the numeral 126. The oscillator 10 supplies the reference voltage for that magnetic demodulator; and a source of D.C. reference voltage, which is generally denoted by the numeral 149, supplies the reference voltage for the oscillator 10. The magnetic demodulator 126 supplies a variable control voltage to the oscillator 10.

As shown by FIG. 2, one form of oscillator that can be used in the control system of the present invention includes the center-tapped primary winding of a transformer; and the halves of that winding are denoted by the numerals 14 and 18. The center tap 12 of that primary winding is connected to the negative terminal of a regulated source of D.C. voltage; and the positive terminal of that source is grounded. The upper end of the half-winding 14 is connected to the collector of a transistor 20, and the lower end of the half-winding 18 is connected to the collector of a transistor 22. The emitter of transistor 20 is spaced above ground by a resistor 24, and the emitter of transistor 22 is spaced above ground by a resistor 26. By-pass capacitors 27 and 29 are provided for the resistors 24 and 26, respectively. A resistor 28 and a capacitor 30 are connected in parallel intermediate the collector of transistor 22 and the base of transistor 20; and a capacitor 32 and a resistor 34 are connected in parallel intermediate the collector of transistor 20 and the base of transistor 22. A resistor 36 extends between the base of transistor 20 and a junction 40, and a resistor 38 extends between the base of transistor 22 and that junction. That junction is spaced above ground by a resistor 42; and that junction receives the control voltage for the oscillator 10.

The oscillator 10 shown in FIG. 2 is a multivibrator oscillator; and the transistor 20 will be cut off when the transistor 22 is fully conducting, and the transistor 22 will be cut off when the transistor 20 is fully conducting.

The half-winding 14 will be the collector load for the transistor 20, and the capacitor 32 will couple the variations in voltage at the upper end of the half-winding 14 to the base of transistor 22. The half-winding 18 will be the collector load for the transistor 22, and the capacitor 30 will couple the variations in voltage at the lower end of the half-winding 18 to the base of the transistor 20. The output frequency of the oscillator 10 will be the supervised frequency of the control system provided by the present invention; and the capacitor 32 will coact with its parallel-connected resistor 34 and the capacitor 30 will coact with its parallel-connected resistor 28 to provide the time constants that will be relied upon to set the specified value for the output frequency of the oscillator 10. However, that output frequency can be made to vary as the voltage drop across the resistor 42 is varied. Specifically, the output frequency of the oscillator 10 can be made to increase by decreasing the voltage drop across resistor 52; and that output frequency can be made to decrease by increasing the voltage drop across that resistor.

The voltage drop across the resistor 42 will be determined by the current flowing through a transistor 46. The collector of that transistor is connected to a terminal 50 by a junction 48; and the terminal 50 will be suitably connected to the negative terminal of a regulated source of D.C. voltage. The positive terminal of that source will be grounded. The emitter of the transistor 46 is connected to the upper end of the resistor 42, and the lower end of that resistor is grounded. The greater the conductivity of the transistor 46, the greater the voltage drop across the resistor 42 and the lower the output frequency of oscillator 10. Conversely, the lesser the conductivity of the transistor 46, the lesser the voltage drop across the resistor 42 and the higher the output frequency of oscillator 10. The junction 45 connects resistor 42 to the junction 40 in the multivibrator oscillator.

The base of the transistor 46 is connected to the emitter of a transistor 54 which has its collector connected to the terminal 50 by the junction 48. The emitter of the transistor 54 is spaced from ground by a resistor 56. The transistors 54 and 46 constitute an amplifier that determines the voltage drop across the resistor 42 and thus helps determine the supervised frequency of the control system provided by the present invention.

The numeral 58 denotes a secondary winding of the transformer which has the half-windings 14 and 18. That transformer also has a secondary winding 60 and a center-tapped secondary winding 62. The center tap of the winding 62 is denoted by the numeral 64. The voltages in all of the secondary windings will have the same phase.

The secondary winding 58 is connected to a load 70 by terminals 66 and 68; and in one preferred embodiment of the present invention, that load is a resistor. Where that load is a part of a static inverter, that load will provide the required pulsing for the inverter.

The numeral 72 denotes the input coil of the tuning fork 76, and that coil is directly connected to the secondary winding 60. The output coil of the tuning fork 76 is denoted by the numeral 74; and that coil is coupled to a serially-connected capacitor 82 and an inductor 80 by an isolating capacitor 78. The capacitor 82 and the inductor 80 act as a low-pass filter which constitutes the phase-shifting network 81; and the lower end of that network and the lower end of coil 74 are grounded. The capacitor 78 keeps direct current from flowing in the output coil of the tuning fork 76. The capacitor 82 and the inductor 80 shift the phase of the voltage from the output coil 74 approximately ninety degrees. The phase-shifting network 81 should have a low Q; because such a Q will avoid serious drift due to temperature-induced changes in the capacitance of capacitor 82 and in the inductance of inductor 80.

A junction 86 is provided intermediate the capacitor 82 and the inductor 80, and that junction is connected to the base of a transistor 90 by a junction 88. The collector of that transistor is connected to a terminal 96 by an inductor 92 and a junction 94. The terminal 96 is connected to the negtaive terminal of a suitable source of D.C. voltage, and the positive terminal of that source is grounded. A resistor 98 is connected intermediate the junctions 94 and 88, and a resistor 100 is connected between the junction 88 and ground. The resistors 98 and 100 establish the D.C. voltage for the base of the transistor 90. The numerals 102 and 104 denote series-connected resistors which are connected intermediate ground and the emitter of the transistor 90; and a by-pass capacitor 106 is connected in parallel with the resistor 104.

The numeral 108 denotes a coupling capacitor that connects the collector of the transistor 90 to the base of a transistor 110; and the collector of the transistor 110 is connected to the terminal 96 by the junction 94. A resistor 112 is connected intermediate the junction 94 and the base of the transistor 110, and a resistor 114 is connected between that base and ground. The resistors 112 and 114 established the D.C. voltage for the base of the transistor 110. The transistors 90 and 110 constitute the amplifier 91 which is connected to the phase-shifting network 81.

The emitter of the transistor 110 is connected to one end of the primary winding of a transformer 116; and the other end of that winding is connected to ground by a resistor 118. A by-pass capacitor 120 is connected in parallel with the resistor 118. The transformer 116 constitutes the signal transformer for the magnetic demodulator 126; and the center-tapped winding 62 constitutes the secondary winding of the reference transformer for that magnetic demodulator.

The center-tapped secondary winding of the transformer 116 is denoted by the numeral 122, and the ends of that winding are connected to the terminals 144 of a phase sensitive diode ring demodulator. That diode ring demodulator includes a diode 128, a resistor 130, a diode 132, a resistor 134, a diode 136, a resistor 138, a diode 140, and a resistor 142. While different forms of diodes could be utilized, semi-conductor rectifiers are very useful. The ends of the center-tapped secondary winding 62 are connected to the other terminals 146 of the diode ring demodulator. The center tap 124 of the secondary winding 122 is connected to the center tap 64 of the secondary winding 62 through a resistor 158; and that resistor constitutes the load resistor for the magnetic demodulator 126. A by-pass capacitor 160 is connected in parallel with the resistor 158 to make certain that the voltage drop across the resistor 158 is due solely to direct current.

The source of D.C. reference voltage includes a Zener diode 152 which has its cathode grounded and which has its anode connected to the terminal 50 by a resistor 156. A by-pass capacitor 154 is connected in parallel with the Zener diode 152, and a potentiometer 148 also is connected in parallel with the Zener diode. The movable contact of the potentiometer 148 can be adjusted to provide a desirable D.C. reference voltage; and that reference voltage is applied to the base of the transistor 54 by the resistor 158 and a junction 162. That reference voltage determines the normal bias for the transistor 54; and that bias is set so that transistor is normally conductive. The normally conductive nature of transistor 54 provides a voltage drop across the resistor 56; and that voltage drop is such that the bias for the transistor 46 normally makes that transistor conductive. The current flowing through the transistor 46 will provide a voltage drop across the resistor 42; and that voltage drop will normally be of such a value that the output frequency of the oscillator 10 will be at its specified value.

The load resistor 158 of the magnetic demodulator 126 will operate with substantially zero voltage drop across it whenever the voltages across the input and output coils 72 and 74, respectively, of the tuning fork 76 are in phase; because the voltages in the secondary windings 60 and 62 are in phase and the voltage from the output coil 74 is shifted substantially ninety degrees by the phase-shifting network 81. Hence there will normally be no voltage drop across the load resistor 158; and the bias supplied by the source of D.C. reference voltage 149 will normally cause transistors 54 and 46 to provide a voltage drop across resistor 42 that will hold the supervised frequency at its specified value.

However, whenever the voltage across the input coil 72 of the tuning fork 76 gets out of phase with the voltage across the output coil 74 of that tuning fork, a voltage drop will appear across the load resistor 158; and the polarity of that voltage drop will be determined by whether the voltage across the input coil 72 leads or lags the voltage across the output coil 74. Specifically, if the output frequency of the oscillator 10 goes up, the voltage across the output coil 74 of the tuning fork 76 will lag the voltage across the input coil 72; and the diode ring demodulator will create a voltage drop across the load resistor 158 of such polarity as to subtract from the bias supplied by the source of D.C. reference voltage 149. The resulting increase in conductivity of the transistor 54 will make the bias for the transistor 46 less negative; and the resulting increase in conductivity of the transistor 46 will increase the voltage drop across the resistor 42. That increased voltage drop will cause the frequency of oscillation of the oscillator 10 to decrease; and that decrease will be such that the frequency of oscillation of the oscillator 10 will return to its specified value.

Conversely, if the frequency of the oscillator 10 goes down, the voltage across the output coil 74 of the tuning fork 76 will lead the voltage across the input coil 72; and the diode ring demodulator will create a voltage drop across the load resistor 158 of such polarity as to add to the bias supplied by the source of D.C. reference voltage 149. The resulting increase in conductivity of the transistor 54 will make the bias for the transistor 46 more negative; and the resulting decrease in conductivity of the transistor 46 will decrease the voltage drop across the resistor 42. That decreased voltage drop will cause the output frequency of the oscillator 10 to increase; and that increase will be such that the output frequency of the oscillator 10 will return to its specified value.

The phase shift that occurs whenever the output frequency of oscillator 10 rises or falls relative to the specified value is shown by FIG. 3. The ordinate is Degrees of Phase Shift of Voltage Across Output Coil Relative to Voltage Across Input Coil; and the abscissa is Frequency in cycles per second. For the particular tuning fork represented by FIG. 3, an increase of as little as one tenth of a cycle per second in the supervised frequency will cause a lagging phase shift of approximately twenty degrees; and this means that a change of twenty five thousandths of a percent in the output frequency of the oscillator 10 produces a phase shift of almost twenty degrees. From this it should be apparent how sensitive the control system of the present invention is, and how closely that control system can hold the supervised frequency.

Conversely, a decrease of as little as one tenth of a cycle per second in the supervised frequency of FIG. 3 will cause a leading phase shift of approximately twenty degrees. Again, this means that a change of twenty five thousandths of a percent in the supervised frequency produces a phase shift of almost twenty degrees. Such a phase shift enables the control system provided by the present invention to act fully and promptly to restore the supervised frequency to its specified level. The overall result is that the frequency of the pulses supplied to the load 70 are held within extremely close limits; and this is the desired result.

The control system shown by FIG. 2 is very useful and workable; but it can be modified if desired. For example, if desired, a diode could be connected in parallel with the half-winding 14 and a second diode could be connected in parallel with the half-winding 18. Such diodes would provide extra protection for the transistors 20 and 22.

The control system of FIG. 2 utilizes two transistors, namely, transistor 54 and transistor 46, to make sure that the current needed to provide the requisite voltage drop across the resistor 42 is supplied to that resistor. However, the transistor 54 would be able to supply sufficient current to the resistor 42 for oscillators ranging up to two hundred milliwatts of power; and with such oscillators, the transistor 46 can be omitted.

The control system of FIG. 2 utilizes two transistors, namely, transistor 90 and transistor 110, in the amplifier 91. However, in some instances it will be possible to use just one transistor in that amplifier; and in those cases either of those transistors can be deleted.

The Zener diode 152 fixes the value of the D.C. reference voltage for the base of the transistor 54; and hence the control system provided by the present invention is largely independent of changes in line voltage. However, if changes in line voltage should ever begin to affect the operation of the control system provided by the present invention, a constant current source could be provided for the Zener diode; and one such source is shown by FIG. 4. The numerals 148, 152 and 154 denote a potentiometer, a Zener diode and a by-pass capacitor, respectively, which are identical to the correspondingly numbered elements in FIG. 2. The upper ends of potentiometer 148, Zener diode 152 and by-pass capacitor 154 are connected to the collector of an NPN transistor 170. The emitter of that transistor is connected to a terminal 174 by a resistor 172; and the base of that transistor is connected directly to the upper ends of a resistor 178 and a diode 176. The resistor 178 has its lower end grounded, and the diode 176 has its lower end connected to the terminal 174. That terminal, in turn, is connected to the negative terminal of a regulated source of D.C. voltage. The positive terminal of that voltage source is grounded. A fixed amount of current will flow from terminal 174 through diode 176 and resistor 178 to ground; and, in doing so, will fix the bias for the transistor 170. As a result, that transistor will act as a constant current source for the Zener diode.

The by-pass capacitors 154 for the Zener diodes 152 are useful where alternating current and transients can enter the circuit of the Zener diode. However, in circuits wherein alternating current and transients are not a factor, the capacitors 154 can be omitted. Also, the potentiometers 148 can be omitted by careful selection of the Zener diode used.

The magnetic demodulator 126 is very useful and desirable, but other phase demodulators could be used. For example, different kinds of double bridge phase demodulators could readily be used in lieu of the demodulator 126.

Whereas the drawing and accompanying description have shown and described a preferred embodiment of the present invention, it should be apparent to those skilled in the art that various changes may be made in the form of the invention without affecting the scope thereof.

What I claim is:

1. A control system that can provide an accurate frequency reference and that comprises a tuning fork which has an input coil and an output coil, an oscillator that can respond to changes in its input voltage to change its output frequency, a phase-sensitive device that can respond to the phase displacement of two signals to provide a polarized control signal, a connection between said phase-sensitive device and the input of said oscillator that applies said polarized control signal to said input of said oscillator to vary the input voltage of said oscillator, a second connection between the output of said oscillator and said phase-sensitive device to apply the output frequency of said oscillator to said phase-sensitive device, a third connection between the output of said oscillator and said input coil of said tuning fork to apply the output frequency of said oscillator to said input coil of said tuning fork, and a fourth connection between said output coil of said tuning fork and said phase-sensitive device, said tuning fork responding to changes in the output frequency of said oscillator to cause the voltage across the output coil of said tuning fork to be displaced in phase from the voltage across the input coil of said tuning fork, said phase-sensitive device responding to the phase displacement of the voltage across said output coil of said tuning fork, relative to the voltage across said input coil of said tuning fork, to provide a control signal which changes the input voltage of said oscillator and thereby changes the output frequency of said oscillator, said control signal being polarized to force said output frequency of said oscillator to move toward its specified frequency, said phase-sensitive device being a magnetic demodulator, said second connection including the center-tapped secondary winding of a transformer that has its primary winding connected to said oscillator, said third connection including another secondary winding of said transformer, said fourth connection including a phase-shifting network that shifts the voltage of said output coil approximately ninety degrees and also including an amplifier and the signal transformer for said magnetic demodulator, the first said connection including a resistor connected to the center tap of said secondary winding of said second connection and connected to the center tap of the secondary winding of said signal transformer of said fourth connection, said resistor being in a circuit that establishes the input voltage for said oscillator, said magnetic demodulator generating substantially no voltage drop across said resistor as long as the phase displacement between the voltages across the input and output coils of said tuning fork is zero but responding to phase displacement between the voltages across said input and output coils of said tuning fork to generate a polarized voltage drop across said resistor and thereby change the input voltage of said oscillator.

2. A control system that can provide an accurate frequency reference and that comprises a tuning fork which has an input coil and an output coil, an oscillator that can respond to changes in its input voltage to change its output frequency, a phase-sensitive device that can respond to the phase displacement of two signals to provide a polarized control signal, a connection between said phase-sensitive device and the input of said oscillator that applies said polarized control signal to said input of said oscillator to vary the input voltage of said oscillator, a second connection between the output of said oscillator and said phase-sensitive device to apply the output frequency of said oscillator to said phase-sensitive device, a third connection between the output of said oscillator and said input coil of said tuning fork to apply the output frequency of said oscillator to said input coil of said tuning fork, and a fourth connection between said output coil of said tuning fork and said phase-sensitive device, said tuning fork responding to changes in the output frequency of said oscillator to cause the voltage across the output coil of said tuning fork to be displaced in phase from the voltage across the input coil of said tuning fork, said phase-sensitive device responding to the phase displacement of the voltage across said output coil of said tuning fork, relative to the voltage across said input coil of said tuning fork, to provide a control signal which changes the input voltage of said oscillator and thereby changes the output frequency of said oscillator, said control signal being polarized to force said output frequency of said oscillator to move toward its specified frequency, said phase-sensitive device being a magnetic demodulator, said second connection including the center-tapped secondary winding of a transformer that has its primary winding connected to said oscillator, said third connection including another secondary winding of said transformer, said fourth connection including a phase-shifting network that shifts the voltage of said output coil and also including an amplifier and the signal transformer for said magnetic demodulator, the first said connection including a resistor connected to the center tap of said secondary winding of said second connection and connected to the center tap of the secondary winding of said signal transformer of said fourth connection, said resistor being in a circuit that establishes the input voltage for said oscillator, said magnetic demodulator responding to phase displacement between the voltages across said input and output coils of said tuning fork to generate a polarized voltage drop across said resistor and thereby change the input voltage of said oscillator.

3. A control system that can provide an accurate frequency reference and that comprises a tuning fork which has an input coil and an output coil, an oscillator that can respond to changes in its input voltage to change its output frequency, a phase-sensitive device that can respond to the phase displacement of two signals to provide a polarized control signal, a connection between said phase-sensitive device and the input of said oscillator that applies said polarized control signal to said input of said oscillator to vary the input voltage of said oscillator, a second connection between the output of said oscillator and said phase-sensitive device to apply the output frequency of said oscillator to said phase-sensitive device, a third connection between the output of said oscillator and said input coil of said tuning fork to apply the output frequency of said oscillator to said input coil of said tuning fork, and a fourth connection between said output coil of said tuning fork and said phase-sensitive device, said tuning fork responding to changes in the output frequency of said oscillator to cause the voltage across the output coil of said tuning fork to be displaced in phase from the voltage across the input coil of said tuning fork, said phase-sensitive device responding to the phase displacement of the voltage across said output coil of said tuning fork, relative to the voltage across said input coil of said tuning fork, to provide a control signal which changes the input voltage of said oscillator and thereby changes the output frequency of said oscillator, said control signal being polarized to force said output frequency of said oscillator to move toward its specified frequency, said phase-sensitive device being a magnetic demodulator, said second connection including the center-tapped secondary winding of a transformer that has its primary winding connected to said oscillator, said third connection including another secondary winding of said transformer, said fourth connection including a phase-shifting network that shifts the voltage of said output coil approximately ninety degrees and also including the signal transformer for said magnetic demodulator, the first said connection including a resistor, said resistor being in a circuit that establishes the input voltage for said oscillator, said magnetic demodulator generating substantially no voltage drop across said resistor as long as the phase displacement between the voltages across the input and output coils of said tuning fork is zero but responding to phase displacement between the voltages across said input and output coils of said tuning fork to generate a polarized voltage drop across said resistor and thereby change the input voltage of said oscillator.

4. A control system that can provide an accurate frequency reference and that comprises a tuning fork which has an input coil and an output coil, an oscillator that can respond to changes in its input voltage to change its output frequency, a phase-sensitive device that can respond to the phase displacement of two signals to provide a polarized control signal, a connection between said phase-sensitive device and the input of said oscillator that applies said polarized control signal to said input of said oscillator to vary the input voltage of said oscillator, a second connection between the output of said oscillator and said phase-sensitive device to apply the output frequency of said oscillator to said phase-sensitive device, a third connection between the output of said oscillator and said input coil of said tuning fork to apply the output frequency of said oscillator to said input coil of said tuning fork, and a fourth connection between said output coil of said tuning fork and said phase-sensitive device, said tuning fork responding to changes in the output frequency of said oscillator to cause the voltage across the output coil of said tuning fork to be displaced in phase from the voltage across the input coil of said tuning fork, said phase-sensitive device responding to the phase displacement of the voltage across said output coil of said tuning fork, relative to the voltage across said input coil of said tuning fork, to provide a control signal which changes the input voltage of said oscillator and thereby changes the output frequency of said oscillator, said control signal being polarized to force said output frequency of said oscillator to move toward its specified frequency, said phase-sensitive device being a magnetic demodulator, said second connection including the center-tapped secondary winding of a transformer that has its primary winding connected to said oscillator, said third connection including another secondary winding of said transformer, said fourth connection including a phase-shifting network that shifts the voltage of said output coil and also including the signal transformer for said magnetic demodulator, the first said connection including a resistor, said resistor being in a circuit that establishes the input voltage for said oscillator, said magnetic demodulator responding to phase displacement between the voltages across said input and output coils of said tuning fork to generate a polarized voltage drop across said resistor and thereby change the input voltage of said oscillator.

5. A control system that can provide an accurate frequency reference and that comprises a tuning fork which has an input coil and an output coil, an oscillator that can respond to changes in its input voltage to change its output frequency, a phase-sensitive device that can respond to the phase displacement of two signals to provide a polarized control signal, a connection between said phase-sensitive device and the input of said oscillator that applies said polarized control signal to said input of said oscillator to vary the input voltage of said oscillator, a second connection between the output of said oscillator and said phase-sensitive device to apply the output frequency of said oscillator to said phase-sensitive device, a third connection between the output of said oscillator and said input coil of said tuning fork to apply the output frequency of said oscillator to said input coil of said tuning fork, and a fourth connection between said output coil of said tuning fork and said phase-sensitive device, said tuning fork responding to changes in the output frequency of said oscillator to cause the voltage across the output coil of said tuning fork to be displaced in phase from the voltage across the input coil of said tuning fork, said phase-sensitive device responding to the phase displacement of the voltage across said output coil of said tuning fork, relative to the voltage across said input coil of said tuning fork, to provide a control signal which changes the input voltage of said oscillator and thereby changes the output frequency of said oscillator, said control signal being polarized to force said output frequency of said oscillator to move toward its specified frequency, said phase-sensitive device being a magnetic demodulator, said second connection including the center-tapped secondary winding of a transformer that has its primary winding connected to said oscillator, said third connection including another secondary winding of said transformer, said fourth connection including a phase-shifting network that shifts the voltage of said output coil approximately ninety degrees and also including an amplifier and the signal transformer for said magnetic demodulator, the first said connection including a resistor connected to the center tap of said secondary winding of said second connection and connected to the center tap of the secondary winding of said signal transformer of said fourth connection, said resistor being in a circuit that establishes the input voltage for said oscillator.

6. A control system that can provide an accurate frequency reference and that comprises a tuning fork which has an input coil and an output coil, an oscillator that can respond to changes in its input voltage to change its output frequency, a phase-sensitive device that can respond to the phase displacement of two signals to provide a polarized control signal, a connection between said phase-sensitive device and the input of said oscillator that applies said polarized control signal to said input of said oscillator to vary the input voltage of said oscillator, a second connection between the output of said oscillator and said phase-sensitive device to apply the output frequency of said oscillator to said phase-sensitive device, a third connection between the output of said oscillator and said input coil of said tuning fork to apply the output frequency of said oscillator to said input coil of said tuning fork, and a fourth connection between said output coil of said tuning fork and said phase-sensitive device, said tuning fork responding to changes in the output frequency of said oscillator to cause the voltage across the output coil of said tuning fork to be displaced in phase from the voltage across the input coil of said tuning fork, said phase-sensitive device responding to the phase displacement of the voltage across said output coil of said tuning fork, relative to the voltage across said input coil of said tuning fork, to provide a control signal which changes the input voltage of said oscillator and thereby changes the output frequency of said oscillator, said control signal being polarized to force said output frequency of said oscillator to move toward its specified frequency, said phase-sensitive device being a magnetic demodulator, said second connection including the center-tapped secondary winding of a transformer that has its primary winding connected to said oscillator, said third connection including another secondary winding of said transformer, said fourth connection including a phase-shifting network that shifts the voltage of said output coil and also including the signal transformer for said magnetic demodulator, the first said connection including a resistor, said resistor being in a circuit that establishes the input voltage for said oscillator.

References Cited by the Examiner

UNITED STATES PATENTS

| | | | |
|---|---|---|---|
| 2,297,800 | 10/42 | Read | 331—1 |
| 2,752,512 | 6/56 | Sarratt | 331—1 |
| 2,777,955 | 1/57 | Gabor | 331—1 |
| 2,840,640 | 6/58 | Babcock | 333—71 |
| 3,010,073 | 11/61 | Melas | 331—8 |

OTHER REFERENCES

Article by Clark et al. in "Instruments," February 1943, pages 60–62.

ROY LAKE, *Primary Examiner.*

GEORGE N. WESTBY, JOHN KOMINSKI, *Examiners.*